United States Patent [19]
Dischiano

[11] Patent Number: 6,139,403
[45] Date of Patent: Oct. 31, 2000

[54] METHOD AND DEVICE FOR POSITIONING AND ACCESSING A DIE UNDER ANALYSIS

[75] Inventor: John Dischiano, Pfugerville, Tex.

[73] Assignee: Advanced Micro Devices, Sunnyvale, Calif.

[21] Appl. No.: 09/092,678

[22] Filed: Jun. 5, 1998

[51] Int. Cl.$^7$ .................................................. B24B 1/00
[52] U.S. Cl. ............................... 451/41; 451/54; 451/55; 451/57; 451/58
[58] Field of Search .................................. 451/41, 54, 55, 451/57, 58, 59

[56] References Cited

U.S. PATENT DOCUMENTS

| | | | |
|---|---|---|---|
| 5,930,598 | 7/1999 | Willie et al. | 438/108 |
| 5,959,363 | 9/1999 | Yamada et al. | 257/787 |

*Primary Examiner*—Timothy V. Eley

[57] ABSTRACT

A method and device which is provided for thinning flip chip bonded integrated circuit (IC) devices with better accuracy. The method and device permit a successful approach to one portion of the circuit while leaving other portions of the circuit intact. Thus, other portions of the circuit can be the subject of later analysis or can be modified as debugging may require. The method and device provide the above stated capability in an effective and efficient manner.

19 Claims, 3 Drawing Sheets

METHOD AND DEVICE FOR POSITIONING AND ACCESSING A DIE UNDER ANALYSIS

RELATED APPLICATIONS

This application is related to the co-filed and commonly assigned applications; Ser. No. 09/092,674, filed on Jun. 5, 1998, entitled "Method and Device for Supporting Flip Circuitry under Analysis," Ser. No. 09/092,154, filed on Jun. 5, 1998 entitled "Method and Device for Removing a Flip Chip Die from Packaging," Ser. No. 09/090,447, filed on Jun. 4, 1998, entitled "An Alternate Method and Device for Removing A Flip Chip Die From Packaging," Ser. No. 09/092,164, filed on Jun. 5, 1998, entitled "A Method and Device for A Flip Chip Die and Package Holder," which are hereby incorporated by reference.

FIELD OF THE INVENTION

The invention relates to semiconductor device assemblies, and more particularly to techniques for analyzing and debugging circuitry associated with a flip chip bonded integrated circuit.

BACKGROUND OF THE INVENTION

The semiconductor industry has seen tremendous advances in technology in recent years which have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

Flip chip technology answers the demand for improved input/output (I/O) connections from the chip to external systems. On a flip chip, the electrical components are located (face down) on the side of the die which attaches to the chip package. In this manner, the flip chip provides a short interconnection length using, for example, ball-grid array (BGA) solder connections. The self-aligning nature of the solder bumps offers the advantages of higher density mounting, improved electrical performance and reliability, and better manufacturability. The positioning of the circuit side is the source of many advantages in the flip chip design. However, in other regards, the orientation of the die with the circuit side face down on a substrate is a disadvantage.

In example, access to the circuit region is sometimes necessitated order to modify or debug a finished chip. Additionally, access to the circuit region is often required through manufacturing stages in order to test and analyze circuit's integrity. In this event, it is necessary to burrow through the body of the flip chip die or through the chip package in order to access the circuit region.

Various methods have been employed to quickly and effectively access the circuit region. A popular method includes milling or grinding off portions of the die, or the chip packaging in order to burrow through to the circuit region. The difficulty lies in the accuracy of this method. Since the circuit region is formed in a very thin epitaxial layer, with a typical thickness of only 10–20 micrometers ($\mu$m), an overshoot in the milling process can grind through the very circuit for which the testing was intended. Conversely, slowly milling off portions of the chip package is inefficient for mass fabrication procedures. For these reasons, it is necessary to have a method and device which will provide for thinning flip chip bonded integrated circuit (IC) devices with better accuracy. Likewise, a successful approach to one portion of the circuit should desirably leave other portions of the circuit intact so that they can be the subject of later analysis. Thus, to facilitate more effective and efficient back side thinning processes, a measurement method and device is accurately responsive to a desired milling depth is needed.

SUMMARY OF THE INVENTION

The above mentioned problems with integrated circuit technology and other problems are addressed by the present invention and will be understood by reading and studying the following specification. A device and method are described which accord these benefits.

In particular, an illustrative embodiment of the present invention includes a method for accessing a circuit region on a flip chip die. The method includes mounting the flip chip die on a polishing tool. The flip chip die is attached to a chip package. At least two spacers are used to adjust the placement of the flip chip die in the polishing tool. The at least two spacers adjust the placement of the flip chip die to expose portions of the chip package to a polishing blade. The at least two spacers are polished portions taken from the chip package. The circuit of the flip chip die is accessed.

In another embodiment, a device for accessing a circuit region on a flip chip die mounted on a chip package is provided. The device includes a polishing tool. The polishing tool is adapted for mounting the flip chip die within the tool. A number of spacers are removably placed within the polishing tool to adjust the mounting of the flip chip die.

In another embodiment, a system for accessing a circuit region on a flip chip die that is mounted circuit side down on a ceramic package is provided. The system includes a device for accessing the circuit region on the flip chip die. The device includes a polishing tool and the polishing tool is adapted for mounting the flip chip die within the tool. A number of spacers are removably placed within the polishing tool to adjust the mounting of the flip chip die. A controller electrically couples to the polishing tool for controlling the operation of the polishing tool.

Thus, a more effective and efficient method and device are provided for accessing the circuit region on a flip chip die. The measurement method and device, which are responsive to a desired milling depth, facilitate the thinning process necessary to access the circuit region.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

The terms "front," "back," "front side," and "back side" as used in this application may be interchanged and are used principally to suggest a structural relationship with respect to one another. The term "horizontal" is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the structure discussed, regardless of the orientation of the structure.

FIGS. 1A–1E describe generally various steps of an embodiment for accessing the circuitry of a flip chip.

Figure 1A:
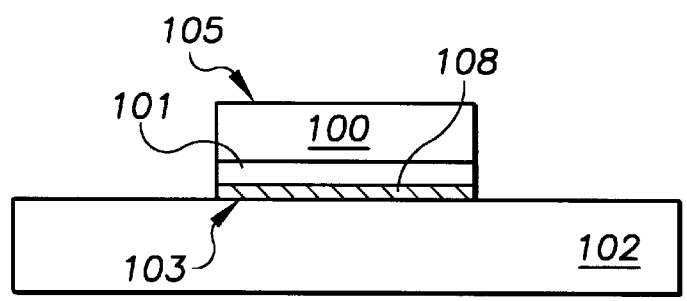
FIGS. 1A–1E show cross-sectional views of successive process steps for accessing flip chip circuitry according to the present invention.

In FIG. 1A, the starting structure is illustrated. The structure includes a flip chip die 100. The flip chip die 100 includes a circuit region 101 located on a front side 103 of the flip chip die 100. The flip chip die 100 further is attached to a chip package 102. The flip chip die 100 is oriented such that the circuit region 101 is adjacent to, or "faces," the chip package 102. An underfill region 108 encases the circuit region 101 and fills the boundary between the circuit region 101 and the chip package 102. In one embodiment, the chip package 102 is a formed from ceramic. In another embodiment, the chip package 102 is formed of any suitable material for supporting and protecting the flip chip die 100 as well as facilitating electrical connections to the circuit region 101. The flip chip die 100 further includes a back side 105.

Figure 1B:
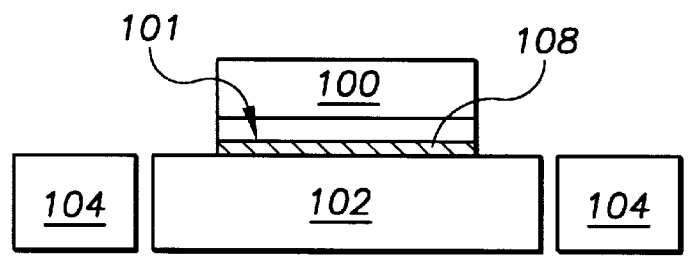

FIG. 1B illustrates the structure following the next sequence of events. At least two spacers 104 are removed from the chip package 102. The at least two spacers are removed from an area outside of the circuit region 101 of the flip chip die 100. In one embodiment, the at least two spacers are removed using a diamond saw to cut the at least two spacers 104 from the chip package 102. In another embodiment, the at least two spacers are removed using any suitable technique which does not harm the circuit region 101 of the flip chip die 100.

Figure 1C:
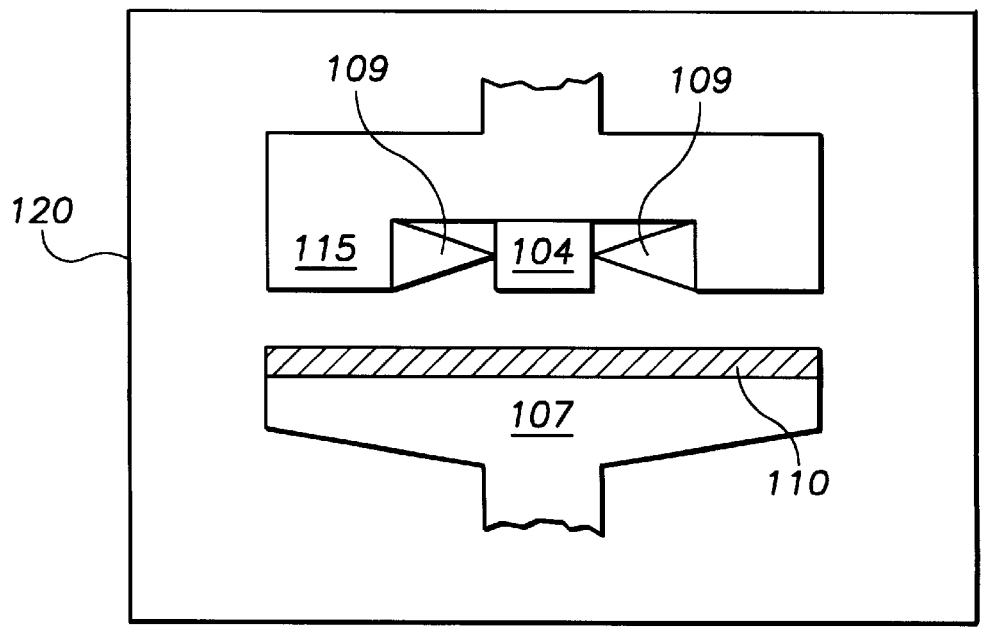

FIG. 1C illustrates the structure following the next sequence of steps. Each of the at least two spacers 104 is placed into a polishing tool 120. The polishing tool 120 includes any suitable tool as used in the semiconductor, or generally device analysis industry. Such polishing tools are well known by those in the art and are commercially available. The polishing tool 120 includes a holder 115 and clamp portions 109 to secure the work piece. The polishing tool further includes a polishing blade 110 mounted onto a polishing bit 107. The polishing blade 110 opposes the holder 115. Once the spacer 104 is secure in place, the polishing tool is operated in a conventional fashion. Each of the spacers 104 is polished in this manner in order to ensure the spacer's 104 planarity. Subsequent to the planarization, the spacers 104 provide an approximation of the thickness of the chip package 102 at its thinnest point.

Figure 1D:
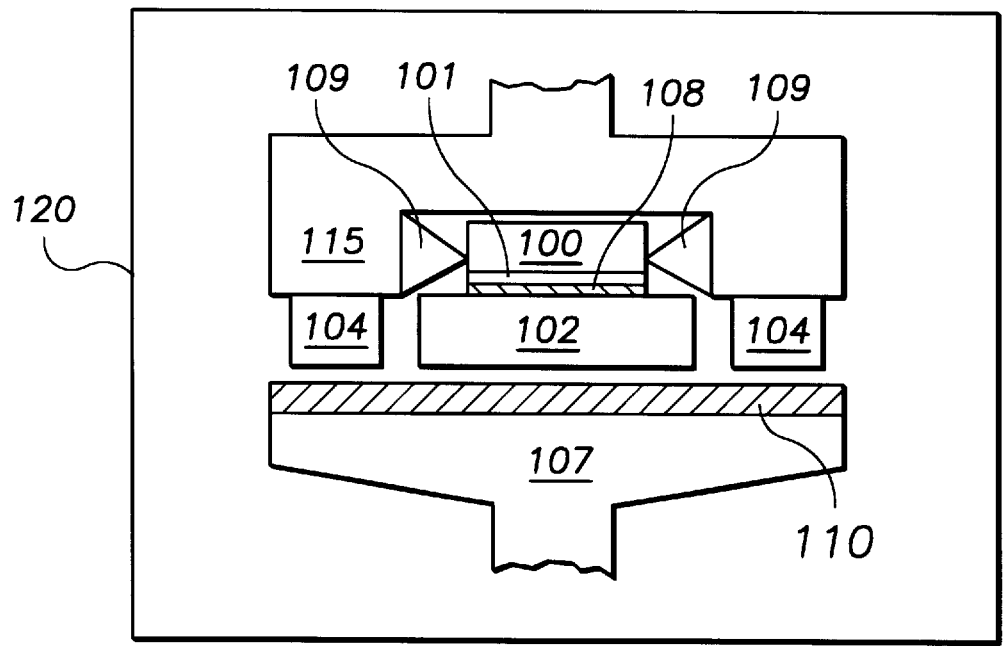

Next, FIG. 1D illustrate the structure following the next series of steps. The polished spacers 104, which were originally taken from the chip package, are placed between the holder 115 and the polishing blade 110 of the polishing tool. The flip chip die 100 along with the circuit region 101 and the chip package 102 are loaded into a polishing tool 120. The at least two spacers 104 are used to adjust the placement of the flip chip die 100 within the polishing tool 120. The particular placement of the flip chip die 100 in the polishing tool 120 exposes the chip package 102 to the polishing blade 110. Once the flip chip die 100 is properly positioned and secured by the clamp portions 109, the spacers 104 are removed.

Figure 1E:
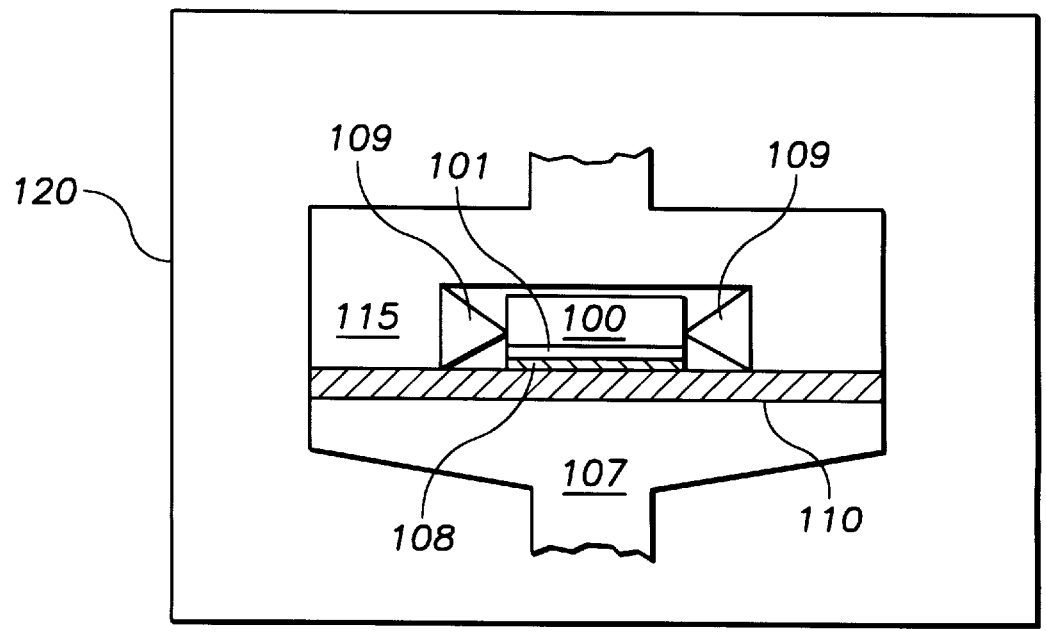

FIG. 1E illustrates the structure following the final sequence of steps according to the present invention. The polishing tool is operated and the chip package 102 is polished through, or "thinned," in order to gain access to the circuit region 101 of the flip chip die 100. In one embodiment, a chip package is removed at different rates. The polishing is performed in multiple steps including a global thinning step and a local thinning step. The global thinning step includes using a first grade polishing blade 110. By way of example, a first grade polishing blade 110 includes a 45 micrometer ($\mu$m) diamond impregnated metal polishing blade. Such blades are commercially available and generally referenced according to the specifications of the polishing tool 120 selected for use. A local thinning step is next achieved using a second grade polishing blade 110. The designation "first" or "second" is not intended to refer to the manufacturing quality of the polishing blade, but rather the abrasiveness grade of the chosen polishing blade 110. By way of example, a second grade polishing blade includes a 30 $\mu$m diamond impregnated metal polishing blade.

Figure 2:
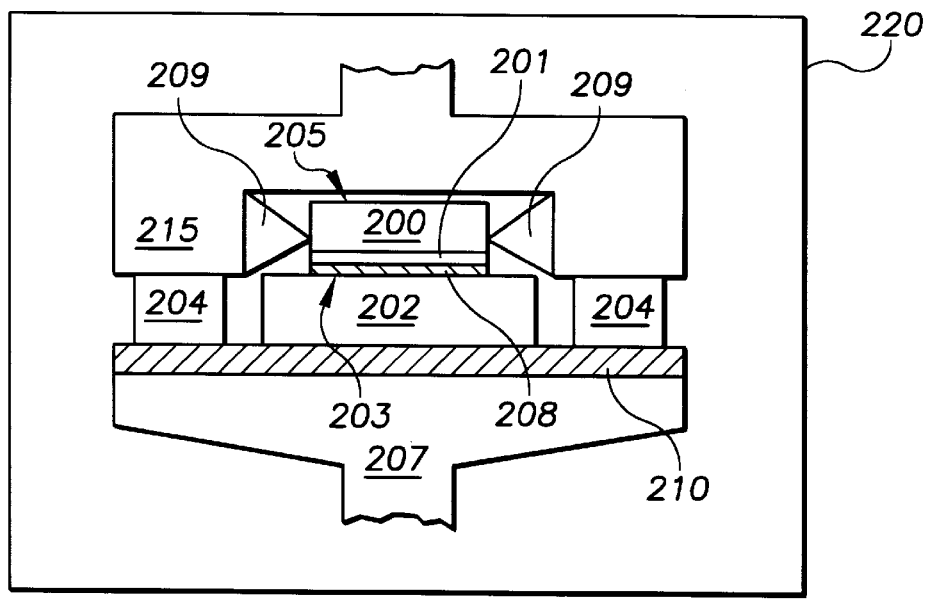
FIG. 2 illustrates a device for accessing flip chip circuitry according to the present invention.

In one embodiment, rotating the polishing blade 110 involves rotating the polishing blade 110 in one direction and rotating the holder 115 in the opposite direction. Polishing off the chip package 102 includes polishing off the entire chip package to expose an underfill portion 108 of the flip chip die 100. In polishing, or "thinning," the chip package, the polishing blade is rotated between 50 and 120 rpm. The structure is now as is illustrated in FIG. 1E. All of the chip package 102 has been removed to expose the underfill region 108. From this stage forward, the circuit region 101 is readily accessible for analysis. The underfill region 108 is removed using conventional methods, which are well known by those in the art. The present invention includes numerous variations to the embodiment described above. FIG. 2 illustrates a device for accessing flip chip circuitry according to the present invention. The device includes a polishing tool 220. The polishing tool 220 includes any suitable tool as used in the semiconductor, or generally in the semiconductor device analysis industry. Such polishing tools 220 are well known by those in the art and are commercially available. The polishing tool 220 includes a holder 215 and clamp portions 209 to secure the work piece. The polishing tool further includes a polishing blade 210 mounted onto a polishing bit 207. The polishing blade 210 opposes the holder 215. In one embodiment, the holder 215 is rotatable in a direction counter to the rotation of the polishing blade 210. A flip chip die 200 is held within the holder 215 of the polishing tool 220. Clamping devices 209 secure the flip chip die 200 in place. The flip chip die 200 further includes a circuit region 201 located on a front side 203 of the flip chip die 200. The flip chip die 200 further is attached to a chip package 202. The flip chip die 200 is oriented such that the circuit region 201 is adjacent to, or "faces," the chip package 202. An underfill region 208 encases the circuit region 201 and fills the boundary between the circuit region 201 and the chip package 202. In one embodiment, the chip package 202 is a formed from ceramic. In another embodiment, the chip package is formed of any suitable material for supporting and protecting the flip chip die 200 as well as facilitating electrical connections to the circuit region 201. The flip chip die 200 further includes a back side 205. The flip chip die 200 is oriented in the holder 215 such that the chip package 202 is exposed to the polishing blade 210.

The device includes a number of spacers 204. The number of spacers 204 are removably placed within the polishing tool to adjust the mounting of the flip chip die. In one embodiment, the spacers 204 are placed between the holder 215 and the polishing blade 210 of the polishing tool. The number of spacers 204 are planarized, or "polished," spacers 204. The number of spacers 204 are portions previously removed from the chip package 202. The number of spacers 204 are spacers removed from an area of the chip package 202 outside of the circuit region 201 of the attached flip chip die 200. The number of spacers 204 provide an approximation of the thickness of the chip package 202 at its thinnest point.

Figure 3:
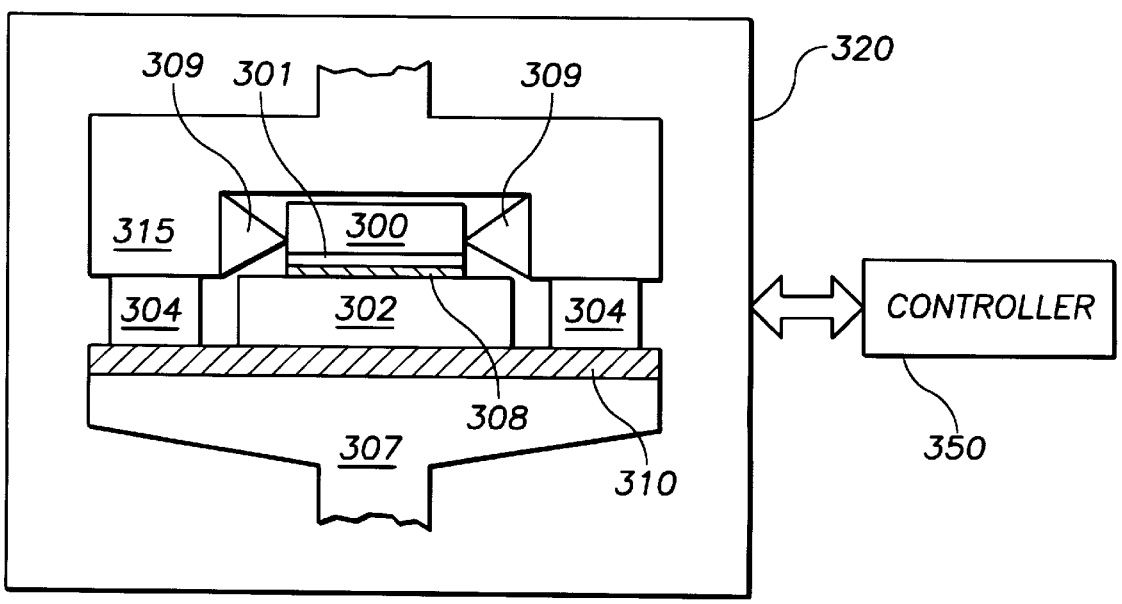
FIG. 3 is a block diagram of a system in accordance with an embodiment of the present invention.

FIG. 3 is a block diagram of a system in accordance with an embodiment of the present invention. FIG. 3 illustrates a controller 350. By way of example, the controller includes an electrical controller. In one embodiment, the controller 350 includes a micro controller as the same are readily accessible for industry needs. In another embodiment, the controller includes a central processing unit (CPU) as part of a computer operated tool configuration. Other types of controllers are well known to those in the art and would be equally suit for use in the present invention. The controller 350 is electrically coupled to a polishing tool 320. The polishing tool 320 matches the device presented above.

Thus, present invention provides more effective and efficient method and device for accessing the circuit region on a flip chip die. The method and device allow for an improved "thinning" technique. In effect, a measurement method and device are included which are very responsive to a desired milling depth.

Although specific embodiments have been illustrated and described herein. it is appreciated by those of ordinary skill in the art that any arrangement which is calculated to achieve the same purpose may be substituted for the specific embodiments shown.

Therefore, it is manifestly intended that this invention be limited only by the claims and the equivalents thereof.

What is claimed is:

1. A method for accessing a circuit region on a die, the method comprising:

mounting the die on a polishing tool, the die being attached to a chip package; and using at least two spacers to adjust the placement of the die in the polishing tool, wherein the at least two spacers are provided from portions of the chip package; and using the polishing tool to polish the die and accessing the circuit of the die.

2. The method of claim 1, wherein the polishing tool comprises:

a holder, the holder holding the die;

a polishing blade, the polishing blade opposing the holder; and a polishing bit, the polishing bit holding the polishing blade.

3. The method of claim 2, wherein using the at least two spacers to adjust the placement of the die comprises exposing portions of the chip package to the polishing blade.

4. The method of claim 1, further including removing the at least two spacers from the chip package by cutting the at least two spacers from the chip package; and polishing the at least two spacers.

5. The method of claim 4, wherein the step of removing the at least two spacers from the chip package comprises using a diamond saw to cut the at least two spacers from the chip package.

6. The method of claim 1, wherein the step of accessing comprises polishing off portions of the chip package.

7. The method of claim 1, wherein the step of accessing comprises polishing off portions of the chip package at different rates.

8. The method of claim 1, wherein the step of accessing the circuit of the flip chip die comprises:

a global thinning step; and a local thinning step.

9. The method of claim 8, wherein the global thinning step comprises using a first grade polishing blade, and wherein the local thinning step comprises using a second grade polishing blade.

10. The method of claim 1, wherein the step of accessing comprises polishing off portions of the chip package, and wherein polishing comprises rotating a polishing blade in one direction and rotating a holder in the opposite direction.

11. The method of claim 10, wherein the step of rotating the polishing blade comprises rotating the polishing blade between 50 and 120 rpm.

12. The method of claim 1, wherein the accessing step comprises polishing off the entire chip package in order to expose an underfill portion of the flip chip die.

13. A method for accessing a circuit region on a flip chip die, the method comprising:

mounting the flip chip die on a polishing tool, the flip chip die being attached to a chip package; and using at least two spacers to adjust the placement of the flip chip die in the polishing tool, wherein the at least two spacers are provided from portions of the chip package; and using the polishing tool to polish the die and accessing the circuit of the flip chip die; and removing by cutting the at least two spacers from the chip package.

14. The method of claim 13, further including planarizing the spacers.

15. The method of claim 13, wherein the spacers are removed by cutting the portions via a diamond saw.

16. The method of claim 13, further including adjusting the tool to the height of the spacers.

17. The method of claim 16, further including removing the spacers after adjusting the tool.

18. The method of claim 13, further including securing a position of the tool using the spacers.

19. The method of claim 18, further including removing the spacers after adjusting the tool.

* * * * *

UNITED STATES PATENT AND TRADEMARK OFFICE
CERTIFICATE OF CORRECTION

PATENT NO.    : 6,139,403
DATED         : October 31, 2000
INVENTOR(S)   : Dischiano It is certified that error appears in the above-identified patent and that said Letters Patent is hereby corrected as shown below:

<u>Title page,</u>
Item [75], Inventor, "Pfugerville" should read -- Pflugerville --.

<u>Column 1,</u>
Line 56, "necessitated order" should read -- necessitated in order --.

<u>Column 2,</u>
Line 13, "method and device is accurately" should read -- method and device that is accurately --.

<u>Column 3,</u>
Line 42, "102 is a formed from ceramic" should read -- 102 is formed from ceramic --.

<u>Column 4,</u>
Line 7, "FIG. 1D illustrate" should read -- FIG.1D illustrates --.

<u>Column 5,</u>
Line 8, "202 is a formed from" should read -- 202 is formed from --.
Line 38, "equally suit for use" should read -- equally suitable for use --.
Line 49, "described herein. it is" should read -- described herein, it is --.

<u>Column 6,</u>
Lines 18 and 20, "wherein the step of accessing" should read -- wherein the step of using the polishing tool --.

UNITED STATES PATENT AND TRADEMARK OFFICE
CERTIFICATE OF CORRECTION

PATENT NO.   : 6,139,403
DATED        : October 31, 2000
INVENTOR(S)  : Dischiano It is certified that error appears in the above-identified patent and that said Letters Patent is hereby corrected as shown below:

Column 6 cont'd,
Lines 23-26, "wherein the step of accessing the circuit of the flip chip die comprises:
       a global thinning step; and
       a local thinning step."
should read -- wherein the step of using the polishing tool comprises:
       a global thinning of the die; and
       a local thinning of the die. --

Signed and Sealed this

Eighteenth Day of March, 2003

JAMES E. ROGAN
*Director of the United States Patent and Trademark Office*